United States Patent
Jeon et al.

(10) Patent No.: US 10,153,732 B2
(45) Date of Patent: Dec. 11, 2018

(54) AMPLIFIER CIRCUIT AND METHOD OF RECOVERING INPUT SIGNAL IN THE AMPLIFIER CIRCUIT

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Insu Jeon, Seoul (KR); Jhinhwan Lee, Daejeon (KR); Hwansoo Suh, Gunpo-si (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 9 days.

(21) Appl. No.: 15/364,433

(22) Filed: Nov. 30, 2016

(65) Prior Publication Data
US 2017/0155363 A1    Jun. 1, 2017

(30) Foreign Application Priority Data
Nov. 30, 2015    (KR) .................. 10-2015-0169278

(51) Int. Cl.
  *H03F 1/36*   (2006.01)
  *H03F 1/02*   (2006.01)
  *H03F 3/45*   (2006.01)

(52) U.S. Cl.
  CPC ....... *H03F 1/0205* (2013.01); *H03F 3/45475* (2013.01); *H03F 2203/45116* (2013.01); *H03F 2203/45526* (2013.01)

(58) Field of Classification Search
  CPC ............... H03F 1/0205; H03F 3/45475; H03F 2203/45116; H03F 1/36; H03F 3/28; H03F 3/36; H03F 1/34; H03F 1/38; H03F 3/68
  USPC .......................................................... 330/75
  See application file for complete search history.

(56) References Cited

U.S. PATENT DOCUMENTS

| | | | |
|---|---|---|---|
| 5,703,910 A * | 12/1997 | Durvaux | H04L 27/233 330/135 |
| 6,424,132 B1 | 7/2002 | Wrathall | |
| 6,737,841 B2 | 5/2004 | Wrathall | |
| 7,138,873 B2 * | 11/2006 | Chandra | H03F 1/34 330/278 |
| 8,232,828 B2 | 7/2012 | Iizuka et al. | |
| 8,390,374 B2 * | 3/2013 | Alexander | H03F 3/45475 330/147 |
| 9,094,081 B1 * | 7/2015 | Steinbrecher | H04B 1/0014 |

(Continued)

FOREIGN PATENT DOCUMENTS

| KR | 10-1070118 B1 | 10/2011 |
|---|---|---|
| KR | 10-2015-0088472 A | 8/2015 |

*Primary Examiner* — Khanh V Nguyen
(74) *Attorney, Agent, or Firm* — Sughrue Mion, PLLC

(57) ABSTRACT

An amplifier circuit and a method of recovering an input signal in the amplifier circuit are provided. The amplifier circuit may recover an input signal by using a time constant and an output signal of a signal amplifier which is delayed by a certain period, based on characteristics of an inverse Laplace transform of a transfer function of the signal amplifier. A time required for recovering the input signal may be shorter than the time constant of the signal amplifier.

18 Claims, 15 Drawing Sheets

(56) References Cited

U.S. PATENT DOCUMENTS

| | | | |
|---|---|---|---|
| 2002/0093321 A1 | 7/2002 | Wrathall | |
| 2009/0191833 A1* | 7/2009 | Kaczman | H03F 1/301 455/296 |
| 2011/0217941 A1* | 9/2011 | Hosoya | G06F 3/033 455/130 |
| 2014/0340145 A1 | 11/2014 | Funato et al. | |

* cited by examiner

AMPLIFIER CIRCUIT AND METHOD OF RECOVERING INPUT SIGNAL IN THE AMPLIFIER CIRCUIT

CROSS-REFERENCE TO RELATED APPLICATION

This application claims the benefit of Korean Patent Application No. 10-2015-0169278, filed on Nov. 30, 2015 in the Korean Intellectual Property Office, the disclosure of which is incorporated herein by reference in its entirety.

BACKGROUND

1. Field

Exemplary embodiments relate to amplifier circuits and methods of recovering an input signal in the amplifier circuits.

2. Description of the Related Art

An amplifier circuit amplifies an input signal and outputs an amplified signal. Examples of the amplifier circuit include a current amplifier circuit, a voltage amplifier circuit, and a current/voltage conversion amplifier circuit, which are classified according to a type of an input/output signal. Specifically, since the current/voltage conversion amplifier circuit receives a small current signal and converts the received small current signal into a voltage signal having a similar waveform to the small current signal, the current/voltage conversion amplifier circuit has been applied to various fields, such as a scanning tunneling microscope, a photoelectric amplifier, an ion detector, and a mass spectrometer.

However, when an amplified signal is output, a response delay may occur according to components included in the amplifier circuit. The response delay may vary according to a time taken until a signal reaches a normal state after the signal is input to the amplifier circuit. The response delay may lead to a delay in generating an output signal corresponding to the input signal, and may result in performance degradation of a feedback circuit.

SUMMARY

Exemplary embodiments address at least the above problems and/or disadvantages and other disadvantages not described above. Also, the exemplary embodiments are not required to overcome the disadvantages described above, and may not overcome any of the problems described above.

One or more exemplary embodiments provide methods of recovering an input signal having a removed response delay from an output signal of an amplifier circuit.

According to an aspect of an exemplary embodiment, there is provided an amplifier circuit for recovering an input signal includes: a signal amplifier configured to amplify the input signal to generate an analog output signal; and a signal processor configured to convert the analog output signal into a digital output signal and recover the input signal based on a transfer function of the signal amplifier that uses the digital output signal and a time constant of the signal amplifier.

The transfer function of the signal amplifier may have a single pole.

A time required for the signal processor to recover the input signal may be shorter than the time constant of the signal amplifier.

The signal processor may include: a first signal converter configured to receive the analog output signal from the signal amplifier and convert the received analog output signal into the digital output signal; and a signal recoverer configured to recover the input signal based on the time constant of the signal amplifier, the digital output signal, and a delayed signal of the digital output signal.

The amplifier circuit may further include a second signal converter configured to receive the recovered input signal from the signal recoverer and convert the received recovered input signal into an analog input signal.

When the signal recoverer samples the digital output signal for a first period, the digital output signal may be delayed by an integer multiple of the first period.

The signal amplifier may include an operational amplifier, a resistor, and a capacitor.

The input signal may be a current signal ranging between an order of magnitude in nanoamperes (nA) and an order of magnitude in attoamperes (aA), and the analog output signal may be a voltage signal.

The amplifier circuit may further include a feedback calculator configured to calculate a correction value by comparing the input signal with a preset threshold value.

The time constant of the signal amplifier may be in a range of about 1 µs to about 1 ms, and the first period is in a range of about 10 kHz to about 10 MHz.

According to an aspect of another exemplary embodiment, there is provided a method of recovering an input signal in an amplifier circuit includes: amplifying the input signal to generate an analog output signal; converting the analog output signal into a digital output signal; and recovering the input signal based on a transfer function that indicates a relationship between the input signal and the analog output signal and uses a time constant and the digital output signal.

The transfer function may have a single pole.

In the recovering of the input signal, a time required for recovering the input signal may be shorter than the time constant.

The method may further include converting the recovered input signal into an analog input signal.

In the recovering of the input signal, a delayed signal of the digital output signal may be used for recovering the input signal.

In the recovering of the input signal, when the digital output signal is sampled for a first period, the digital output signal may be delayed by an integer multiple of the first period.

The input signal may be obtained by subtracting the product of the delayed signal and a first variable from the digital output signal, and the first variable may be expressed by the time constant and an exponential function.

The input signal may be a current signal ranging between an order of magnitude in nanoamperes (nA) and an order of magnitude in attoamperes (aA), and the analog output signal may be a voltage signal.

The method may further include calculating a correction value by comparing the input signal with a preset threshold value.

The time constant may be in a range of about 1 µs to about 1 ms, and the first period may be in a range of about 10 kHz to about 10 MHz.

BRIEF DESCRIPTION OF THE DRAWINGS

The above and/or other aspects will be more apparent by describing certain exemplary embodiments, with reference to the accompanying drawings, in which.

Figure 8A:
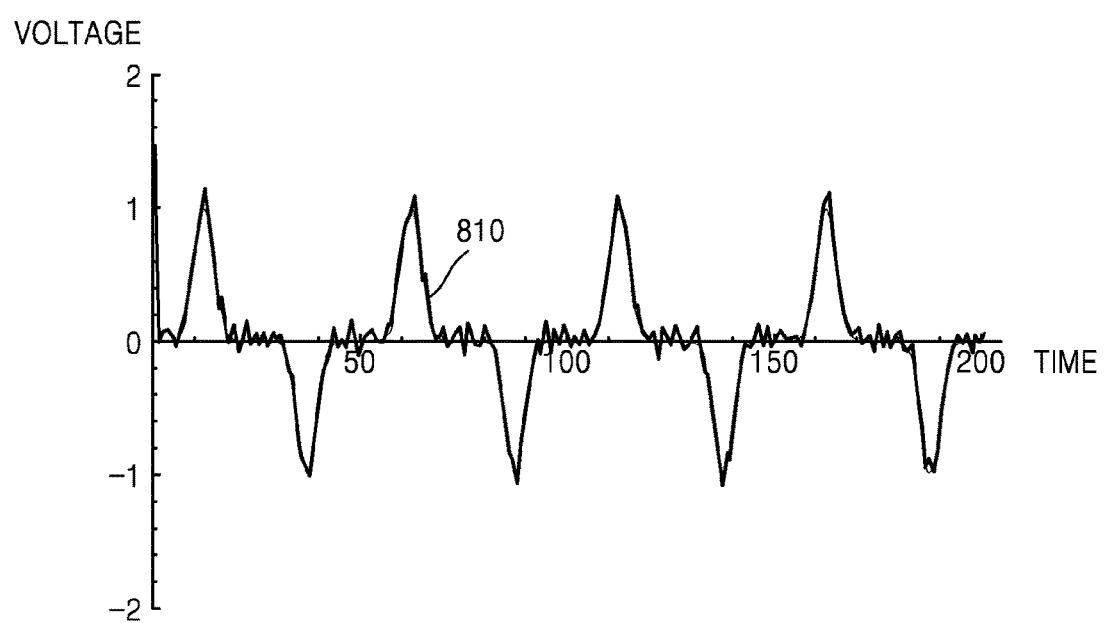
FIG. 8A is a graph showing a result obtained by recovering an input signal by using an output signal when a coefficient (γ) of a delayed output signal is $$e^{-\frac{T}{\tau}},$$
Figure 8B:
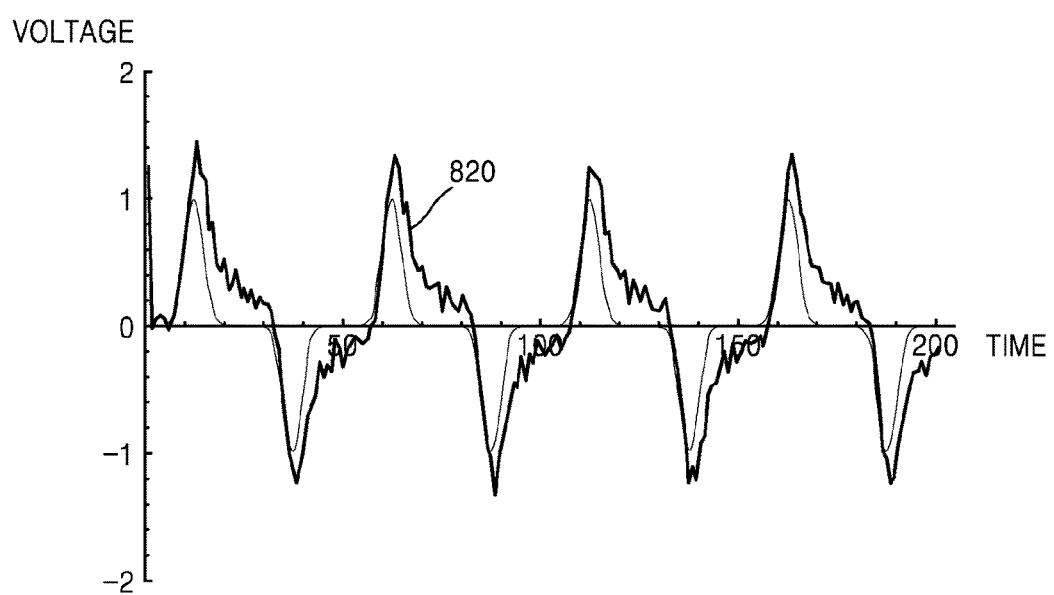
Figure 8C:
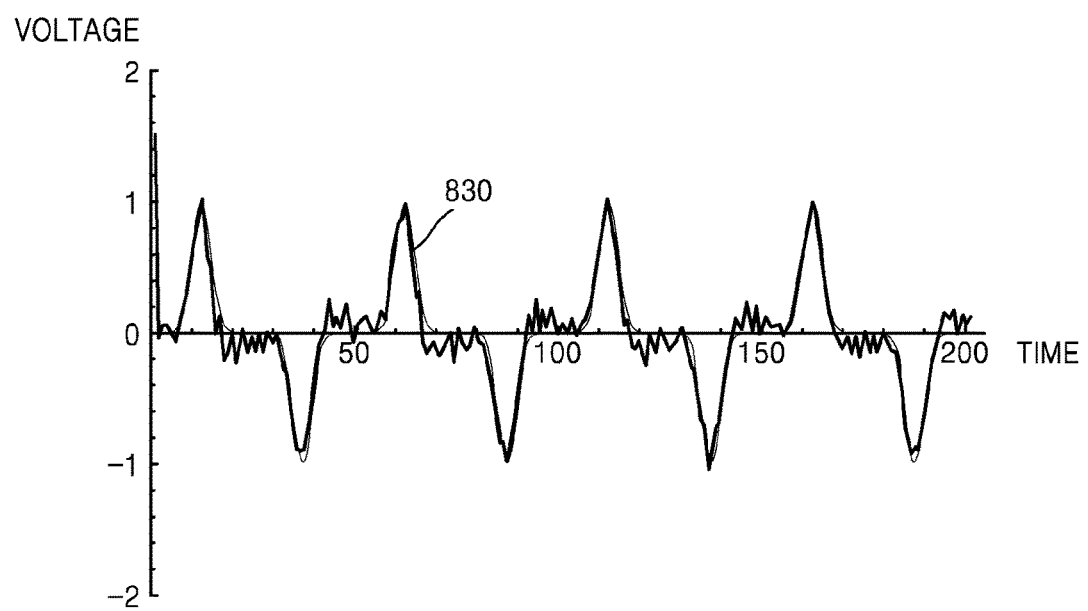
Figure 9:
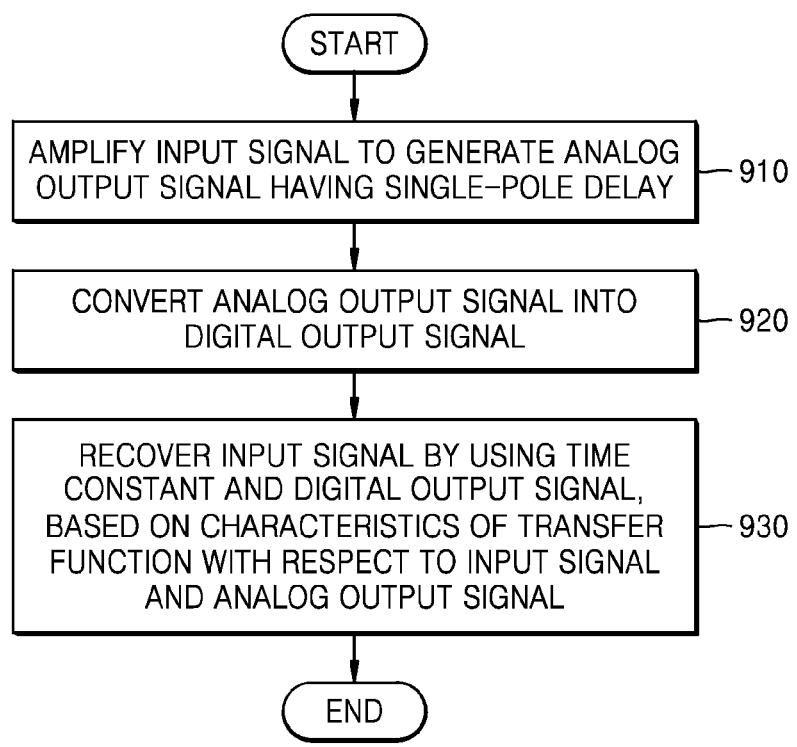
Figure 10:
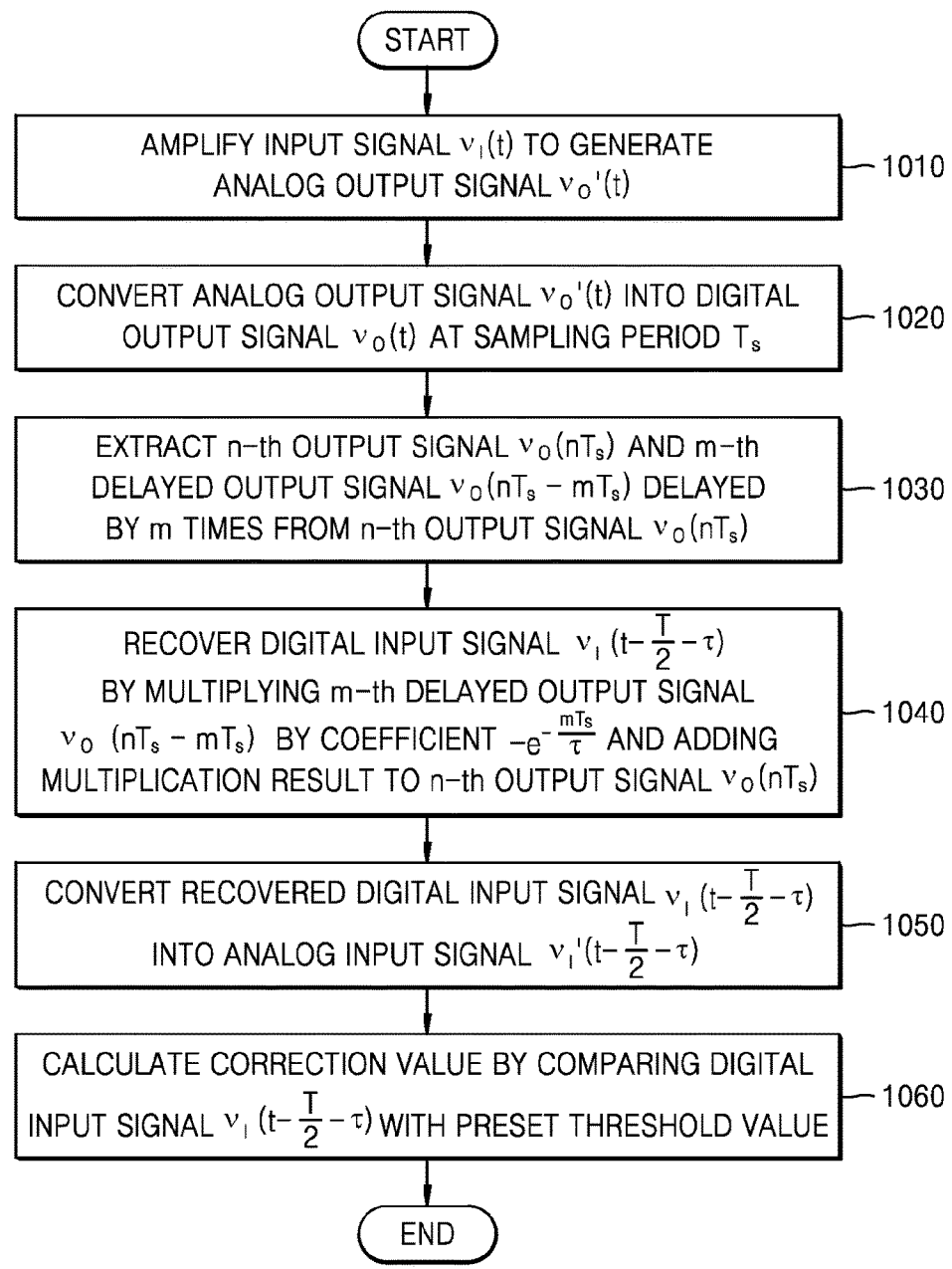

according to an exemplary embodiment;

FIG. 8B is a graph showing a result obtained by recovering an input signal by using an output signal when a coefficient (γ) of a delayed output signal is less than $$e^{-\frac{T}{\tau}},$$

according to another exemplary embodiment;

FIG. 8C is a graph showing a result obtained by recovering an input signal by using an output signal when a coefficient (γ) of a delayed output signal is greater than $$e^{-\frac{T}{\tau}},$$

according to another exemplary embodiment;

FIG. 9 is a flowchart of a method of recovering an input signal in an amplifier circuit, according to an exemplary embodiment; and FIG. 10 is a flowchart of a method of recovering an input signal in an amplifier circuit, according to another exemplary embodiment.

DETAILED DESCRIPTION

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail It will be understood that when a region is referred to as being "connected to" or "coupled to" another region, it may be directly connected or coupled to the other region or intervening regions may be present. It will also be understood that the terms "comprises", "includes", and "has", when used herein, specify the presence of stated elements, but do not preclude the presence or addition of other elements, unless otherwise defined. Also, the terms "unit" and "module" used herein represent a unit for processing at least one function or operation, which may be implemented by hardware, software, or a combination of hardware and software.

The terms "comprises", "includes", and "has" should not be construed as necessarily including elements or operations described in the present disclosure and will be construed as not including some of the elements or operations or further including additional elements or operations.

In the following exemplary embodiments, a small-letter function represents a function in a time domain, and a capital-letter function represents a function in an s domain (complex frequency domain). For example, a voltage input signal $v_I$ represents a voltage input signal $v_I(t)$ in a time domain, and a voltage input signal $V_I$ represents a voltage input signal $V_I(s)$ in an s domain.

Figure 1:
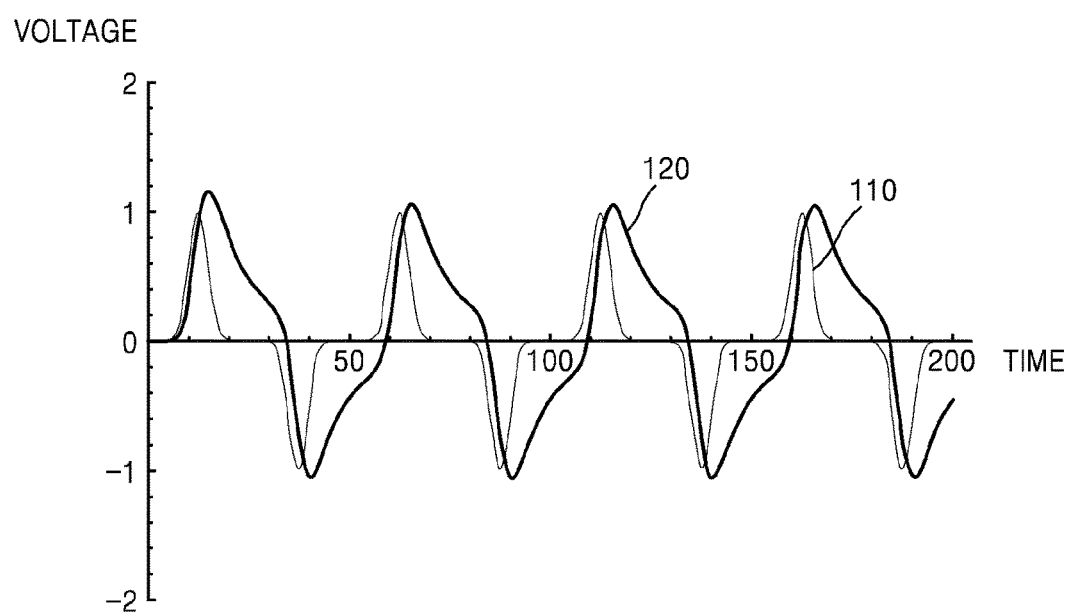
FIG. 1 is a graph showing an input function and an output function of a signal amplifier in a time domain.

FIG. 1 is a graph showing an input function and an output function of a signal amplifier in a time domain.

An output signal 120 illustrated in FIG. 1 may be a signal from which an amplification gain of the signal amplifier is removed. An amplitude of the output signal 120 may be similar to an amplitude of an input signal 110. However, due to a response delay of the signal amplifier, a time delay occurs until the input signal 110 is outputted as the output signal 120. The response delay may vary according to a time constant of the signal amplifier. The time constant may mean a time taken until the output signal 120 reaches a normal state after the signal amplifier operates. The time constant may vary according to components of the signal amplifier.

For example, in the case of a first-order signal amplifier including a resistor and a capacitor, a time constant is equal to the product of a resistance and a capacitance. Therefore, when the first-order signal amplifier has a large resistance and a large capacitance, a time constant thereof may increase, resulting in an increase in a response delay. On the other hand, in the case of a first-order signal amplifier including a resistor and an inductor, a time constant is equal to the division of an inductance over a resistance. Therefore, when the first-order signal amplifier has a large inductance and a small resistance, a time constant thereof may increase, resulting in an increase in a response delay.

As a signal amplifier, a micro current/voltage conversion amplifier is configured to receive a current signal ranging between nanoampere (nA) and attoampere (aA) and output a voltage signal having a waveform similar to the current signal. Since the micro current/voltage conversion amplifier has a large time constant, it takes a long time until the output voltage signal reaches a normal state. In particular, if it takes a long time until the output voltage signal reaches the normal state, a delay time between an output signal and an input signal increases, causing performance degradation of a circuit for feeding back the input signal according to the output signal. Therefore, there may be a need for a method of providing a signal having an improved response delay in an amplifier circuit.

Figure 2:
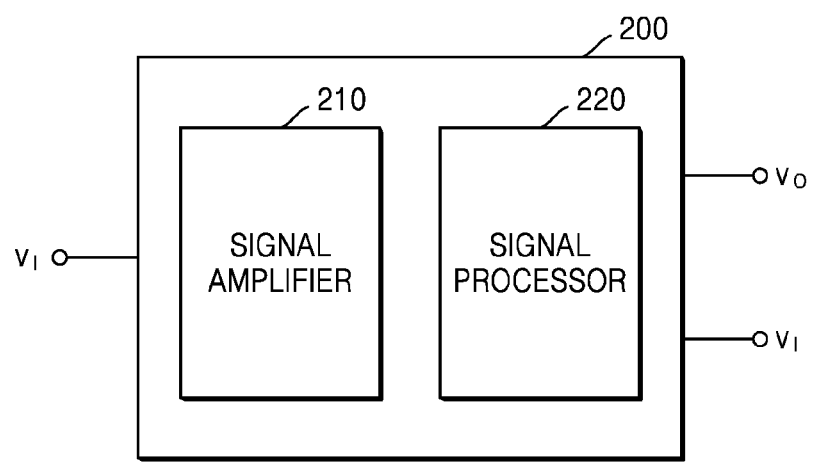
FIG. 2 is a block diagram of an amplifier circuit for recovering an input signal, according to an exemplary embodiment.

FIG. 2 is a block diagram of an amplifier circuit for recovering an input signal, according to an exemplary embodiment.

Referring to FIG. 2, the amplifier circuit 200 for recovering the input signal may include a signal amplifier 210 and a signal processor 220. Examples of the amplifier circuit 200 may include a broadband amplifier circuit for acquiring a uniform amplification factor in a broad frequency band, a narrowband amplifier circuit using a tuner circuit including an inductor and a capacitor connected in parallel to each other, and a direct current (DC) amplifier circuit for low frequency amplification, but are not limited thereto.

In addition, the amplifier circuit 200 may amplify the input signal $v_I$ and output an amplified signal as an output signal $v_O$ and may recover the input signal $v_I$ from the output signal $v_O$. Furthermore, the amplifier circuit 200 may calculate a correction value by recovering the input signal $v_I$ corresponding to the output signal $v_O$ and comparing the recovered input signal with a preset threshold value.

While both the input signal $v_I$ and the output signal $v_O$ are illustrated as voltages in FIG. 2, it will be understood by those of ordinary skill in the art that the input signal $v_I$ and the output signal $v_O$ may be different types of signals, such as a current signal and a power signal.

Referring to FIG. 2, the signal amplifier 210 may amplify the input signal $v_I$ and output the amplified signal as the output signal $v_O$.

For example, the signal amplifier 210 may be a micro current/voltage conversion amplifier configured to receive a current signal ranging between nanoampere (nA) and attoampere (aA) and output an amplified voltage signal as an output signal. Since the micro current/voltage conversion amplifier may receive a small current signal and output a voltage signal having a waveform similar to the small current signal, the micro current/voltage conversion amplifier circuit may be applied to various fields including various measurement devices. Specifically, examples of the measurement devices including the micro current/voltage conversion amplifier may include a scanning tunneling microscope (STM) for determining a structure of a sample from a tunneling phenomenon caused by electrons, a photoelectric amplifier for measuring light, an ion detector, and a mass spectrometer, but are not limited thereto.

In addition, the signal amplifier 210 may be a first-order circuit. The first-order circuit may refer to a circuit of which a relationship between an input signal and an output signal is expressed by a first-order differential equation. Examples of the first-order circuit may include an RL circuit implemented by a resistor and an inductor and an RC circuit implemented by a resistor and a capacitor.

Characteristics of the signal amplifier 210 may be analyzed by using a transfer function H(s) thereof. The transfer function H(s) of the signal amplifier 210 may be defined as a ratio of an s-domain output signal to an s-domain input signal as follows.

$$H(s) = \frac{V_O(s)}{V_I(s)} \quad \text{[Mathematical Equation 1]}$$

In Mathematical Equation 1, $V_O(s)$ and $V_I(s)$ respectively denote an output signal and an input signal in an s domain. The s domain is a complex frequency domain that may be used instead of a time domain when a differential equation is solved based on a Laplace transform. Specifically, the Laplace transform is an integral transform for solving a differential equation. The Laplace transform is widely used for solving a simultaneous equation or a differential equation and is widely used in engineering fields including electronics.

It may be determined through the transfer function H(s) whether the signal amplifier 210 corresponds to a single-pole amplifier. The single-pole amplifier refers to an amplifier of which a transfer function H(s) has a single pole. That is, the single-pole amplifier may be defined as an amplifier of which a transfer function H(s) has a single s that makes a denominator of the transfer function H(s) be zero. In the singe-pole amplifier, an output signal does not oscillate and reaches a normal state after a certain time has passed. Therefore, the single-pole amplifier may be applied to an amplifier circuit configured to amplify a signal and output an amplified signal.

In addition, the signal processor 220 of the amplifier circuit 200 may receive the output signal of the signal amplifier 210 and recover the input signal from the output signal of the signal amplifier 210. The signal processor 220 will be described below in detail with reference to the accompanying drawings.

Figure 3:
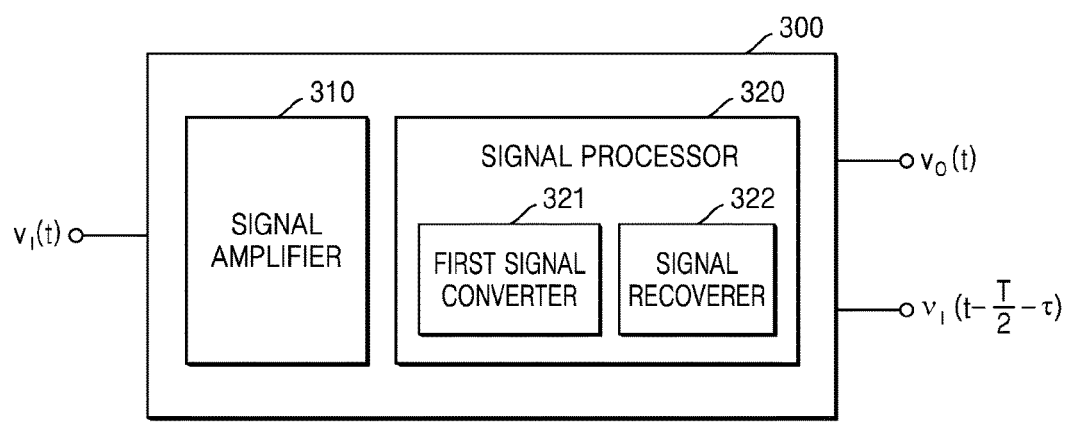
FIG. 3 is a block diagram of an amplifier circuit for recovering an input signal, according to another exemplary embodiment.

FIG. 3 is a block diagram of an amplifier circuit for recovering an input signal vI(t), according to another exemplary embodiment.

Referring to FIG. 3, the amplifier circuit 300 for recovering the input signal $v_I(t)$ may include a signal amplifier 310 and a signal processor 320. The signal processor 320 may include a first signal converter 321 and a signal recoverer 322. Since the signal amplifier 310 corresponds to the signal amplifier 210 of FIG. 2, detailed descriptions thereof will be omitted.

The first signal converter 321 may receive an analog output signal from the signal amplifier 310 and convert the received analog output signal into a digital output signal.

The signal recoverer 322 may recover a digital input signal by using a time constant of the signal amplifier 310, the digital output signal, and a delayed signal of the digital output signal (hereinafter, referred to as a delayed digital output signal). Referring to FIG. 3, when the input signal $v_I(t)$ is input to the amplifier circuit 300, the amplifier circuit 300 outputs an amplified output signal $v_O(t)$ and a recovered input signal $$v_I\left(t - \frac{T}{2} - \tau\right).$$

In addition, the signal processor 320 may further include a second signal converter configured to receive the digital input signal from the signal recoverer 322 and convert the received digital input signal into an analog input signal. The second signal converter will be described below in detail with reference to the accompanying drawings.

Figure 4A:
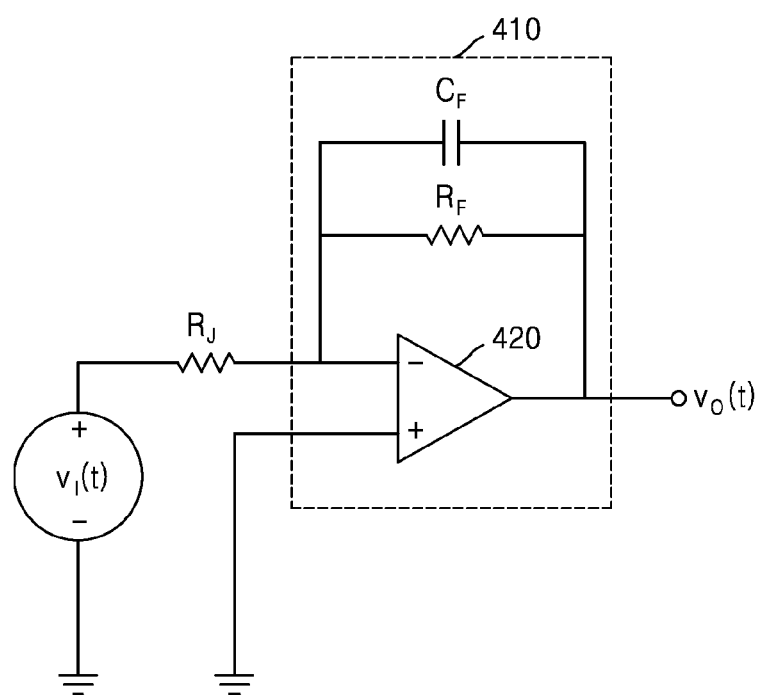
FIG. 4A is a circuit diagram of a signal amplifier according to an exemplary embodiment.

FIG. 4A is a circuit diagram of a signal amplifier according to an exemplary embodiment.

Referring to FIG. 4A, the signal amplifier 410 may include an operational amplifier 420, a resistor having a resistance $R_F$, and a capacitor having a capacitance of $C_F$. The operational amplifier 420 may receive a voltage signal $v_I(t)$ as an input signal and output a voltage signal $v_O(t)$ as an output signal. Assuming that the operational amplifier 420 is an ideal operational amplifier, the output signal $v_O(t)$ may be calculated by performing a Laplace transform on the input signal $v_I(t)$, the resistance $R_F$, and the capacitance $C_F$.

Figure 4B:
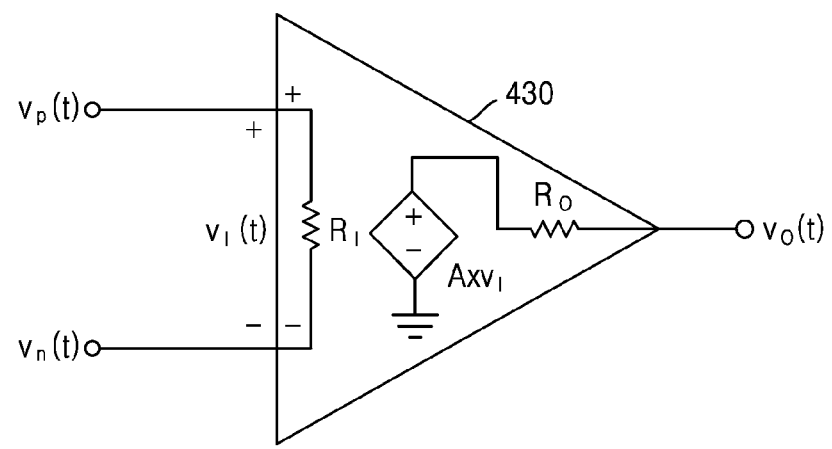
FIG. 4B is a circuit diagram of an ideal operational amplifier.

FIG. 4B is a circuit diagram of an ideal operational amplifier.

Referring to FIG. 4B, an open-loop gain A of the ideal operational amplifier 430 is infinite. An open-loop gain of a real operational amplifier may be about several ten thousands to about several millions, but is not limited thereto.

An input impedance $R_I$ of the ideal operational amplifier 430 is infinite. That is, the infinite input impedance $R_I$ means an open circuit. Therefore, a current flowing into the ideal operational amplifier 430 is substantially 0 A. An input impedance of the real operational amplifier may be in a range of about 1Ω to about 1,000Ω according to a type of an operational amplifier, but is not limited thereto.

An output impedance $R_O$ of the ideal operational amplifier 430 is substantially 0Ω. This means that an output signal $v_O(t)$ of the ideal operational amplifier 430 is all transferred to a load regardless of the resistant value of the load. An output impedance of the real operational amplifier may be in a range of about 35Ω to about 100Ω, but is not limited thereto.

Therefore, when the operational amplifier 420 of FIG. 4A is substantially the same as the ideal operational amplifier 430 of FIG. 4B, a Laplace transform equation $V_O(s)$ of the output signal $v_O(t)$ may be expressed as follows.

$$V_O(s) = H(s) \times V_I(s) = -\frac{R_F}{R_J} \frac{1}{1+sR_FC_F} V_I(s) \quad \text{[Mathematical Equation 2]}$$

In Mathematical Equation 2, H(s) is a transfer function and s is a complex frequency. When the signal amplifier 410 is a first-order RC circuit including a resistor having a resistance $R_F$ and a capacitor having a capacitance $C_F$, as illustrated in FIG. 4A, a time constant t of the signal amplifier 410 may be expressed as follows.

$$\tau = R_F \times C_F \text{ [sec]} \quad \text{[Mathematical Equation 3]}$$

For example, when $R_F$ is $10^9[\Omega]$ and $C_F$ is 0.1 [pF], the time constant τ is equal to $10^{-4}$ [sec]. This means that it takes $10^{-4}$ seconds until the output signal $v_O(t)$ increases up to 63% of a maximum output signal.

Figure 4C:
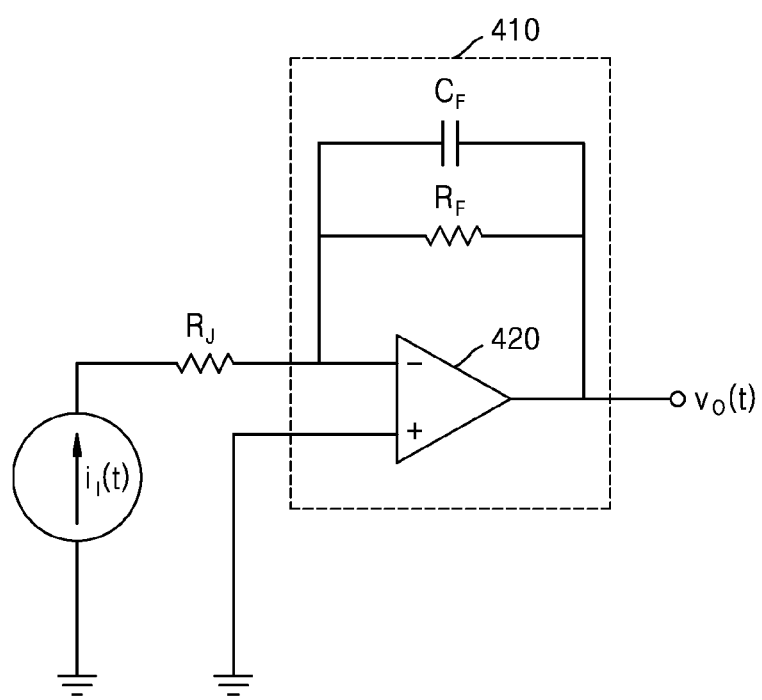
FIG. 4C is a circuit diagram of a signal amplifier according to another exemplary embodiment.

FIG. 4C is a circuit diagram of a signal amplifier according to another exemplary embodiment.

Referring to FIG. 4C, the signal amplifier 410 may receive an input current signal $i_I(t)$ as an input signal. It is assumed that the input current signal $i_I(t)$ satisfies the following relationship: $i_I(t)=v_I(t)/R_J$ [A], where $v_I(t)$ and $R_J$ are respectively the input voltage signal and an input resistance of the signal amplifier 410 illustrated in FIG. 4A. In this case, when the input current signal $i_I(t)$ is input, it may be possible to obtain substantially the same output signal $v_O(t)$ as that of FIG. 4A. Therefore, an amplifier circuit, which includes the signal amplifier 410 receiving the input current signal as the input signal, may be defined as a current/voltage conversion amplifier circuit.

Referring to Mathematical Equation 3, a transfer function H(s) of a first-order single-pole amplifier including a resistor and a capacitor may be expressed by $$-\frac{R_F}{R_J} \frac{1}{1+sR_FC_F}.$$

Therefore, an inverse Laplace transform of the transfer function H(s) may be expressed as follows.

$$\begin{aligned} v_O(t) &= L^{-1}[V_O(s)] \quad \text{[Mathematical Equation 4]} \\ &= L^{-1}[H(s)V_I(s)] \\ &= \int_0^t h(t') \cdot v_I(t-t') \, dt' \\ &= -\frac{R_F}{R_J} \int_{-\infty}^{\infty} dt' \left[ \frac{e^{-\frac{t'}{\tau}}}{\tau} u(t') \right] v_I(t-t') \end{aligned}$$

Assuming that the voltage signal $v_O(t)$ is a function of a time t and a recovered input signal $v_I(t')$ is a function of a time t', a relationship between the time t and the time t' may be established as t'≤t. That is, since the recovered input voltage signal $v_I(t')$ is obtained by using the output signal $v_O(t)$, the time t of the output signal $v_O(t)$ may be always equal to or preceded by the time t' of the input signal $v_I(t')$.

In addition, u(t') is a step function and τ is a time constant. $R_F$ and $R_J$ are respectively a resistance and the input resistance of the signal amplifier 410. Since the step function u(t') is always 1 for t'≥0, the output signal $v_O(t)$ may be expressed as follows.

$$v_O(t) = -\frac{R_F}{R_J} \int_0^{\infty} dt' \frac{e^{-\frac{t'}{\tau}}}{\tau} v_I(t-t') \quad \text{[Mathematical Equation 5]}$$

In addition, by using Mathematical Equation 5, a delayed output signal $v_O(t-T)$ delayed by a delay time T may be expressed as follows.

$$\begin{aligned} v_O(t-T) &= -\frac{R_F}{R_J} \int_0^{\infty} dt' \frac{e^{-\frac{t'}{\tau}}}{\tau} v_I(t-T-t'), \quad \text{[Mathematical Equation 6]} \\ &= -\frac{R_F}{R_J} e^{-\frac{T}{\tau}} \int_0^{\infty} dt'' \frac{e^{-\frac{t''}{\tau}}}{\tau} v_I(t-t'') \end{aligned}$$

In this case, t" is equal to T+t'. When a relationship between the time constant τ and the delay time T is T≪τ, the following equation with respect to $$v_I\left(t - \frac{T}{2}\right)$$

may be obtained by subtracting the product of $v_O(t-T)$ of Mathematical Equation 6 and $$e^{-\frac{T}{\tau}}$$

from the output value $v_O(t)$ of Mathematical Formula 5.

[Mathematical Equation 7]

$$v_O(t) - e^{-\frac{T}{\tau}} v_O(t-T) = -\frac{R_F}{R_J} \int_0^T dt' \frac{e^{-\frac{t'}{\tau}}}{\tau} v_I(t-t') \approx -\frac{R_F}{R_J \tau} v_I\left(t - \frac{T}{2}\right) T$$

Referring to Mathematical Equation 7, in order to accurately recover an input signal $v_I(t-t')$, it may be necessary to solve an integral equation, for example, based on a Richardson-Lucy algorithm. However, the Richardson-Lucy algorithm needs to perform several iterations. Thus, when it is necessary to recover an input signal in real time, it may be difficult to apply the Richardson-Lucy algorithm. Therefore, based on the relationship $T \ll \tau$ between the time constant $\tau$ and the delay time T, it may be possible to deduce the following approximate expression

[Mathematical Equation 8]

$$v_O(t) - e^{-\frac{T}{\tau}} v_O(t-T) \text{ of } v_I\left(t - \frac{T}{2}\right).$$

$$v_I\left(t - \frac{T}{2}\right) \approx -\frac{R_J \tau}{R_F} \frac{v_O(t) - e^{-\frac{T}{\tau}} v_O(t-T)}{T}$$

The delay time T may denote a sampling period of the signal processor 320. Referring to Mathematical Equation 8, the input signal $$v_I\left(t - \frac{T}{2}\right)$$

delayed by T/2 may be recovered by using the time constant $\tau$, the output signal $v_O(t)$, the sampling period T, and the delayed output signal $v_O(t-T)$ delayed by the sampling period T.

That is, since the recovered input signal $$v_I\left(t - \frac{T}{2}\right)$$

is a function of a time delayed by T/2 from t and the sampling period T is much smaller than the time constant $\tau$, it may be considered that a time constant effect of the output signal $v_O(t)$ is removed, as compared with the recovered input voltage signal $$v_I\left(t - \frac{T}{2}\right).$$

When a coefficient $$-\frac{R_J \tau}{R_F T},$$

which determines an amplitude of the recovered input signal $$v_I\left(t - \frac{T}{2}\right),$$

is removed from Mathematical Equation 8, the recovered input signal $$v_I\left(t - \frac{T}{2}\right)$$

may be expressed as follows.

$$v_I\left(t - \frac{T}{2}\right) \approx v_O(t) - e^{-\frac{T}{\tau}} v_O(t-T) \quad \text{[Mathematical Equation 9]}$$
$$= v_O(t) - \gamma \cdot v_O(t-T)$$

Therefore, the signal recoverer 322 may recover the input signal $$v_I\left(t - \frac{T}{2}\right)$$

by using Mathematical Equation 9. In addition, the recovered input signal $$v_I\left(t - \frac{T}{2}\right)$$

may vary according to a coefficient $\gamma$ of the delayed output signal $v_O(t-T)$.

A delay time of the input signal recovered by the real amplifier circuit 300 may be $$\frac{T}{2} + \tau.$$

That is, when recovering the input signal, the signal processor 320 needs to take into consideration the delay caused by the time constant $\tau$. However, since the time constant $\tau$ may be predetermined according to components of the signal amplifier 310, $$v_I\left(t - \frac{T}{2} - \tau\right)$$

may be simply calculated by using the recovered input signal $$v_I\left(t - \frac{T}{2}\right).$$

In addition, performance analysis results obtained when the coefficient $$-\frac{R_J \tau}{R_F T},$$

which determines an amplitude of each of an output function $v_O$ and a recovered input function $v_I$, is removed, are described in the following exemplary embodiments. However, it will be understood by those of ordinary skill in the art that an amplitude ratio of an output signal to an input signal may be equal to or less than about 1.

Figure 5A:
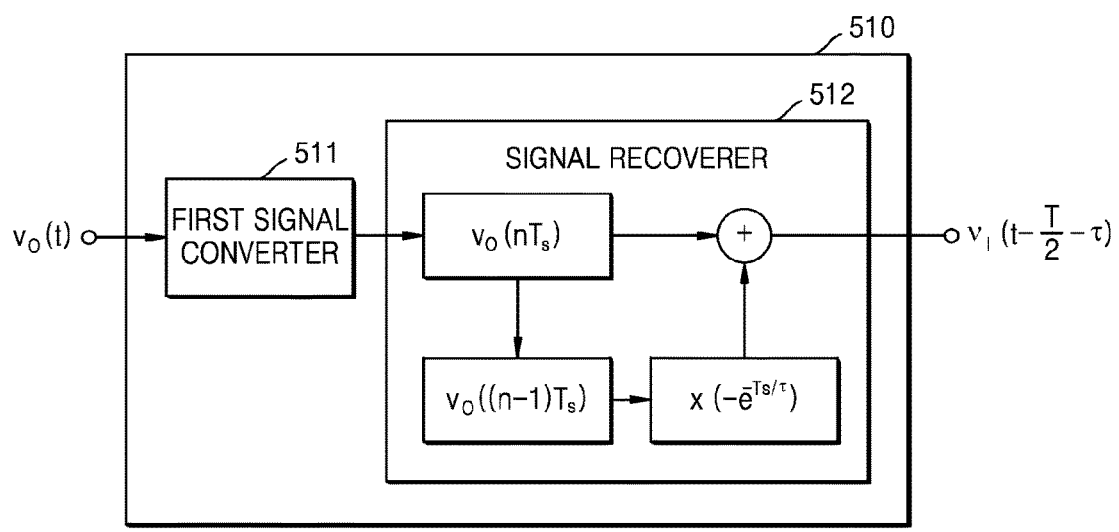
FIG. 5A is a block diagram of an amplifier circuit for recovering an input signal by using an output signal delayed by a sampling period (Ts), according to an exemplary embodiment.
Figure 5B:
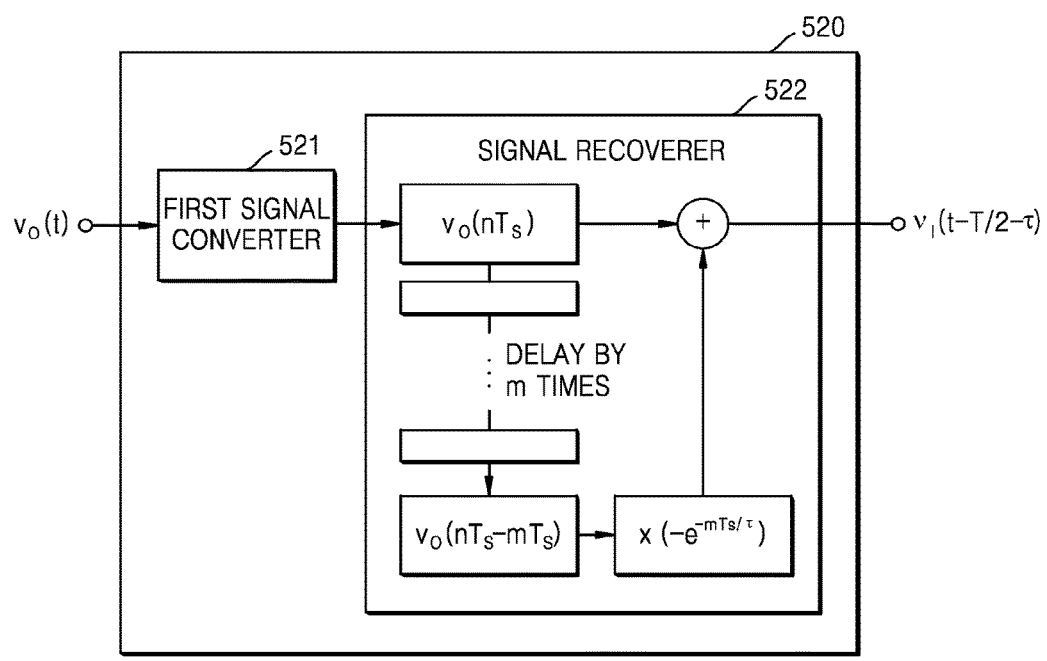
FIG. 5B is a block diagram of an amplifier circuit for recovering an input signal by using an output signal delayed by an integer multiple of a sampling period (Ts), according to another exemplary embodiment.

FIGS. 5A and 5B are block diagrams of amplifier circuits for recovering an input signal by using output signals delayed by different delay times, according to exemplary embodiments.

FIG. 5A is a block diagram of an amplifier circuit for recovering an input signal by using an output signal delayed by a sampling period $T_S$, according to an exemplary embodiment.

Referring to FIG. 5A, a signal processor 510 may include a first signal converter 511 and a signal recoverer 512. The first signal converter 511 may convert an analog output signal into a digital output signal based on the sampling period $T_S$. The signal recoverer 512 may receive the digital output signal, extract an n-th component $v_O(nT_S)$, and extract a delayed digital output signal $v_O((n-1)T_S)$ delayed by the sampling period $T_S$. The signal recoverer 512 may recover the input signal by multiplying the delayed digital output signal $v_O((n-1)T_S)$ by $$-e^{-\frac{T_s}{\tau}}$$

and adding the multiplication result to the n-th component $v_O(nT_S)$ of the digital output signal. At this time, it may be considered that a time required for the signal processor 510 to recover the input signal is the sum of a time required for the first signal converter 511 to convert the analog output signal into the digital output signal and a time required for the signal recoverer 512 to extract an output signal and perform a calculation. When the sampling period $T_S$ is substantially the same as the delay time T of the delayed output signal, the time spent in the first signal converter 511 may be shorter than the time constant τ because the relationship between the sampling period $T_S$ and the time constant τ of the signal amplifier 310 is assumed to be $T_S \ll \tau$ in Mathematical Equation 7. In addition, since the signal recoverer 512 extracts the output signal and performs a simple calculation, the time required for the signal processor 510 to recover the input signal may be shorter than the time constant τ.

FIG. 5B is a block diagram of an amplifier circuit for recovering an input signal by using a delayed output signal delayed by an integer multiple of a sampling period $T_S$, according to another exemplary embodiment.

A signal processor 520 may recover the input signal by using the delayed output signal delayed by the integer multiple of the sampling period $T_S$. That is, a delay time of the delayed output signal may be $mT_S$.

Referring to FIG. 5B, after a signal recoverer 522 extracts an n-th component of a digital output signal received from a first signal converter 521, the signal recoverer 522 may extract a delayed output signal $v_O(nT_S-mT_S)$ delayed by m times from an n-th output signal $v_O(nT_S)$. The delayed output signal $v_O(nT_S-mT_S)$ delayed by m times from the n-th output signal $v_O(nT_S)$ will be referred to as an m-th delayed output signal. A recovered input signal $$v_I\left(t-\frac{T}{2}\right)$$

may be obtained by multiplying the m-th delayed output signal $v_O(nT_S-mT_S)$ by $$-e^{-\frac{mT_s}{\tau}}$$

and adding the multiplication result to the n-the output signal $v_O(nT_S)$.

At this time, a delay time of the input signal recovered by the real signal processor 520 is $$\frac{T}{2}+\tau.$$

That is, when recovering the input signal, the signal processor 520 needs to take into consideration a delay caused by the time constant τ. However, since the time constant τ may be predetermined according to a component of the signal amplifier 310, it will be understood by those of ordinary skill in the art that $$v_I\left(t-\frac{T}{2}-\tau\right)$$

is simply calculated by using the recovered input signal $$v_I\left(t-\frac{T}{2}\right).$$

Figure 6:
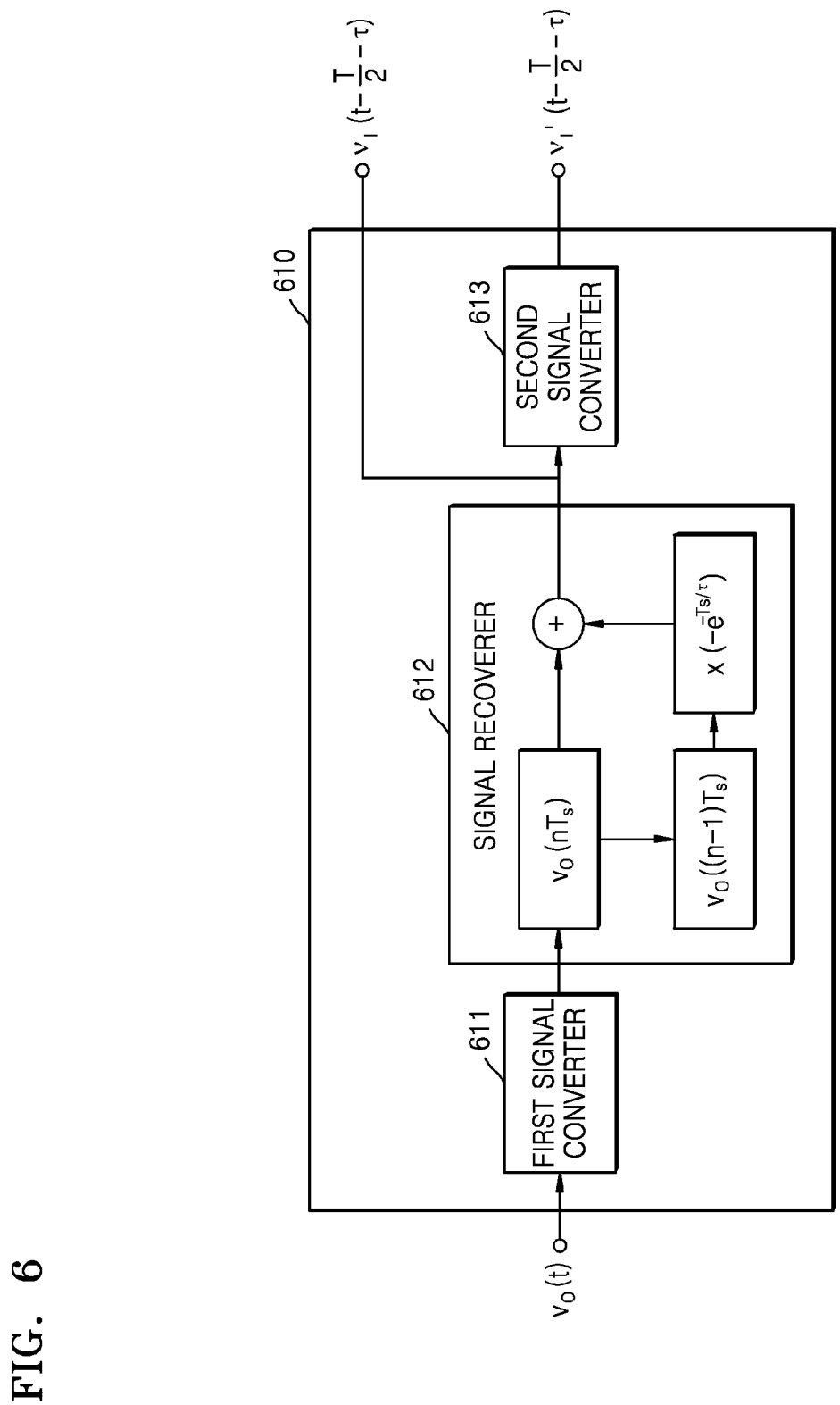
FIG. 6 is a block diagram of an amplifier circuit for recovering an input signal, according to another exemplary embodiment.

FIG. 6 is a block diagram of an amplifier circuit for recovering an input signal, according to another exemplary embodiment.

Referring to FIG. 6, a signal processor 610 may include a first signal converter 611, a signal recoverer 612, and a second signal converter 613. The second signal converter 613 may receive a digital output signal $$v_I\left(t-\frac{T}{2}-\tau\right)$$

from the signal recoverer 612 and convert the received digital output signal $$v_I\left(t-\frac{T}{2}-\tau\right)$$

into an analog output signal $$v'_I\left(t-\frac{T}{2}-\tau\right).$$

Since the first signal converter 611 corresponds to the first signal converter 511 of FIG. 5A, detailed descriptions thereof will be omitted.

In addition, the signal recoverer 612 is illustrated in FIG. 6 as being substantially the same as the signal recoverer 512 of FIG. 5A, but the signal recoverer 612 may be substantially the same as the signal recoverer 522 of FIG. 5B.

Figure 7:
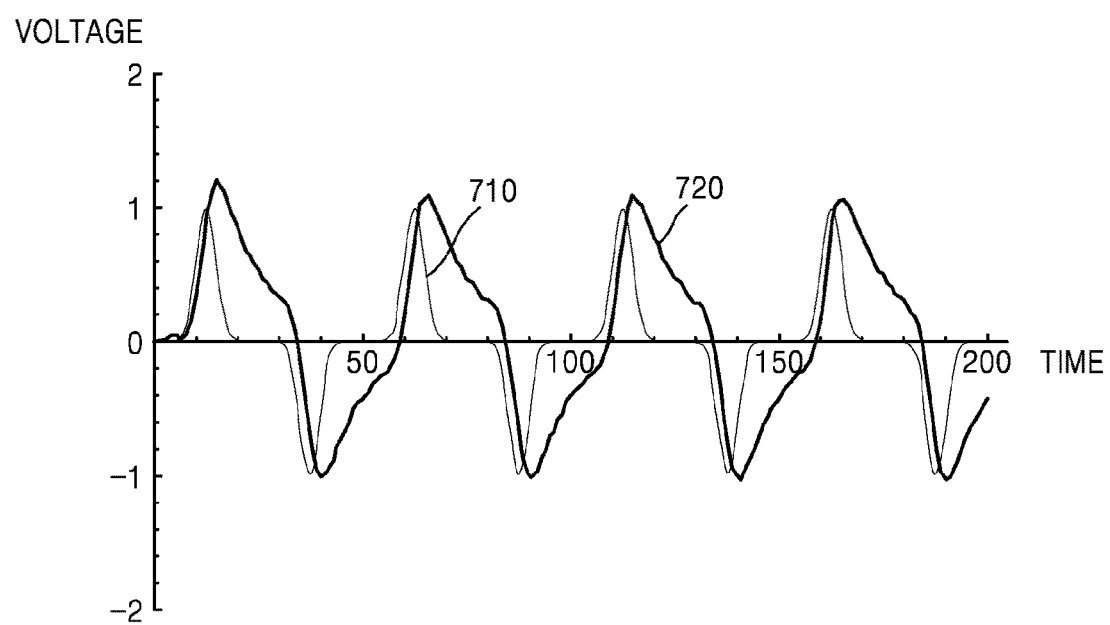
FIG. 7 is a graph showing an input signal and an output signal including a noise signal, according to an exemplary embodiment.

FIG. 7 is a graph showing an input signal and an output signal including a noise signal, according to an exemplary embodiment.

When the input signal 710 is input to the signal amplifier 310 of FIG. 3, the signal amplifier 310 may output the output signal ($\tilde{v}_0(t)$) 720 including the noise signal (n(t)). Referring to FIG. 7, the output signal ($\tilde{v}_0(t)$) 720 of the signal amplifier 310 is a signal from which an amplitude component is removed. The output signal ($\tilde{v}_0(t)$) 720 of the signal amplifier 310 is illustrated as having an amplitude similar to the input signal 710, but it will be understood by those of ordinary skill in the art that an amplitude ratio of the output signal ($\tilde{v}_0(t)$) 720 to the input signal 710 may be equal to or less than about 1.

In addition, the output signal ($\tilde{v}_0(t)$) 720 amplified by the signal amplifier 310 may include an output signal ($v_O(t)$) and the noise signal (n(t)). At this time, in order to perform a performance analysis of the amplifier circuit 300, it was assumed that the noise signal (n(t)) was a signal having a constant power spectrum density throughout all frequencies and was additive white Gaussian noise having a Gaussian distribution on a time axis. Referring to FIG. 7, a response delay may occur in the output signal 720 according to a time constant effect of the signal amplifier 310 as illustrated in FIG. 1.

FIGS. 8A to 8C are graphs showing results obtained by comparing an input signal of the signal amplifier 310 with an input signal recovered according to a coefficient γ of a delayed output signal $v_0(t-T)$ with reference to FIG. 9.

FIG. 8A is a graph showing a result obtained by recovering an input signal by using an output signal when a coefficient (γ) of a delayed output signal is $$e^{-\frac{T}{\tau}},$$

according to an exemplary embodiment;

Specifically, FIG. 8A is a graph showing a result obtained by comparing the input signal 710 input to the signal amplifier 310 with an input signal 810 recovered by using the output signal ($\tilde{v}_0(t)$) 720 including the noise signal (n(t)) of FIG. 7. That is, when the coefficient (γ) of the delayed output signal ($v_O(t-T)$) is $$e^{-\frac{T}{\tau}},$$

it may be possible to recover an input signal similar to the input signal 710 input to the signal amplifier 310.

FIG. 8B is a graph showing a result obtained by recovering an input signal by using an output signal when the coefficient γ of a delayed output signal is less than $$e^{-\frac{T}{\tau}},$$

according to another exemplary embodiment.

FIG. 8C is a graph showing a result obtained by recovering an input signal by using an output signal when the coefficient γ of the delayed output signal is greater than $$e^{-\frac{T}{\tau}},$$

according to another exemplary embodiment.

As illustrated in FIGS. 8B and 8C, when the coefficient γ of the delayed output signal $v_O(t-T)$ is not equal to $$e^{-\frac{T}{\tau}},$$

a greater difference may occur between the input signal 710 and the recovered input signals 820 and 830.

FIG. 9 is a flowchart of a method of recovering an input signal in the amplifier circuit, according to an exemplary embodiment.

In operation 910, the signal amplifier 310 may amplify an input signal to generate an analog output signal having a single-pole delay. The input signal may be a current signal ranging between nanoampere (nA) and attoampere (aA), and the analog output signal may be a voltage signal.

In operation 920, the first signal converter 321 of the signal processor 320 may convert the analog output signal into a digital output signal. The first signal converter 321 may sample the analogue output signal according to the sampling period $T_S$. The sampling period $T_S$ is assumed to be shorter than the time constant τ of the signal amplifier 310.

For example, an STM for determining a structure of a sample may measure an actual spatial image of a surface at a resolution of an atomic level. The STM may inject electrons into a sample surface by using a scan-type sharp conductive tip and determine the structure of the sample by using a tunneling phenomenon caused by the electrons. Since the STM uses a tunneling current signal or a bias voltage, the STM may include a micro current/voltage conversion amplifier. Since the micro current/voltage conversion amplifier included in the STM has a time constant τ of about 1 μs to about 1 ms, a sampling period $T_S$ may be in a range of about 10 kHz to about 10 MHz.

In operation 930, the signal recoverer 322 of the signal processor 320 may recover an input signal $$v_I\left(t - \frac{T}{2}\right)$$

by using the time constant and the digital output signal based on characteristics of the transfer function H(s) with respect to the input signal and the analog output signal. For example, in the case of a first-order amplifier having a single pole, an inverse Laplace transform of the transfer function H(s) may be expressed by the product of an exponential function $$\frac{e^{-\frac{t'}{\tau}}}{\tau}$$

and a step function u(t'). The exponential function $$\frac{e^{-\frac{t'}{\tau}}}{\tau}$$

has a peak value of 1 when f=0 and decreases from the peak value of 1 as t' increases, and the step function u(t') is maintained at 1 when t'≥0. Therefore, the input signal $$v_I\left(t - \frac{T}{2}\right)$$

may be recovered by using an output signal $v_O(t)$ and a delayed output signal $v_O(t-T)$ based on the above-described characteristics. The signal processor 320 may not need to perform iterative calculations, and therefore may recover the input signal in a shorter time than the time constant $\tau$ of the signal amplifier 310.

At this time, the delay time of the input signal recovered by the real signal processor 320 is $$\frac{T}{2} + \tau.$$

That is, when recovering the input signal, the signal processor 320 may need to take into consideration the delay caused by the time constant $\tau$. However, since the time constant $\tau$ may be predetermined according to components of the signal amplifier 310, $$v_I\left(t - \frac{T}{2} - \tau\right)$$

may be simply calculated by using the recovered input signal $$v_I\left(t - \frac{T}{2}\right).$$

Therefore, the input signal may be recovered in real time, and the output signal having a removed response delay may be obtained by comparing the input signal with the recovered input signal.

The delay time T of the delayed output signal may be an integer multiple of the sampling period $T_S$ of the signal processor 320.

FIG. 10 is a flowchart of a method of recovering an input signal in the amplifier circuit, according to another exemplary embodiment.

Since operation 1010 corresponds to operation 910 of FIG. 9, detailed descriptions thereof will be omitted.

In operation 1020, the first signal converter 521 may convert the analog output signal $v_O'(t)$ into a digital output signal $v_O(t)$ based on a sampling period $T_S$.

In operation 1030, the signal recoverer 522 may extract an n-th output signal $v_O(nT_S)$ and an m-th delayed output signal $v_O(nT_S-mT_S)$ delayed by m times from the n-th output signal $v_O(nT_S)$. At this time, n and m are integers.

In operation 1040, the signal recoverer 522 may recover a digital input signal $$v_I\left(t - \frac{T}{2}\right)$$

by multiplying the m-th delayed output signal $v_O(nT_S-mT_S)$ by a coefficient $$-e^{-\frac{mT_s}{\tau}}$$

and adding the multiplication result to the n-th output signal $v_O(nT_S)$. When recovering the input signal, the real signal processor 320 needs to take into consideration the delay caused by the time constant $\tau$. The time constant $\tau$ may be predetermined according to components of the signal amplifier 310. Therefore, $$v_I\left(t - \frac{T}{2} - \tau\right)$$

may be simply calculated by using the recovered digital input signal $$v_I\left(t - \frac{T}{2}\right).$$

In operation 1050, the second signal converter 613 may convert the recovered digital input signal $$v_I\left(t - \frac{T}{2} - \tau\right)$$

into an analog input signal $$v_I'\left(t - \frac{T}{2} - \tau\right).$$

Operation 1050 may be performed when the analog input signal is required, but is not limited thereto.

In operation 1060, the signal processor 520 may calculate a correction value by comparing the digital input signal with a preset threshold value.

For example, the STM may operate in a constant height mode or a constant current mode. The constant current mode may mean a mode of maintaining a tunneling current constant by adjusting a scanner height according to a feedback at each measurement point. When the STM is in the constant current mode, an amplifier circuit included in the STM needs to maintain a current input signal constant. At this time, a correction value for maintaining a constant current may be calculated by using an input signal and an output signal having a removed response delay.

As described above, it may be possible to improve the response delay by recovering the input signal from which the time constant effect of the signal amplifier is removed through a simple calculation.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, it is understood that in exemplary embodiments, one or more units of the above-described apparatuses and devices can include circuitry, a processor, a microprocessor, etc., and may execute a computer program stored in a computer-readable medium.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An amplifier circuit for recovering an input signal, the amplifier circuit comprising:
    a signal amplifier configured to amplify the input signal to generate an analog output signal; and
    a signal processor configured to receive the analog output signal from the signal amplifier, convert the analog output signal into a digital output signal, recover the input signal from the amplified input signal based on a transfer function of the signal amplifier that uses the digital output signal, a time constant of the signal amplifier, and a delayed signal of the digital output signal, and convert the recovered input signal into an analog input signal.

2. The amplifier circuit of claim 1, wherein the transfer function of the signal amplifier has a single pole.

3. The amplifier circuit of claim 1, wherein a time for the signal processor to recover the input signal is shorter than the time constant of the signal amplifier.

4. The amplifier circuit of claim 1, wherein the signal processor comprises:
    a first signal converter configured to receive the analog output signal from the signal amplifier and to convert the received analog output signal into the digital output signal; and
    a signal recoverer configured to recover the input signal based on the time constant of the signal amplifier, the digital output signal, and the delayed signal of the digital output signal.

5. The amplifier circuit of claim 4, further comprising a second signal converter configured to receive the recovered input signal from the signal recoverer and convert the received recovered input signal into the analog input signal.

6. The amplifier circuit of claim 4, wherein, when the signal recoverer samples the digital output signal for a first period, and the digital output signal is delayed by an integer multiple of the first period.

7. The amplifier circuit of claim 1, wherein the signal amplifier comprises an operational amplifier, a resistor, and a capacitor.

8. The amplifier circuit of claim 1, wherein the input signal is a current signal ranging between an order of magnitude in nanoamperes (nA) and an order of magnitude in attoamperes (aA), and the analog output signal is a voltage signal.

9. The amplifier circuit of claim 1, wherein the signal processor is further configured to calculate a correction value by comparing the input signal with a preset threshold value.

10. The amplifier circuit of claim 1, wherein the signal processor is further configured to recover the input signal from the amplified input signal by removing an effect of the time constant of the signal amplifier from the amplified input signal.

11. A method of recovering an input signal in an amplifier circuit, the method comprising:
    amplifying the input signal to generate an analog output signal;
    converting the analog output signal into a digital output signal;
    recovering the input signal from the amplified input signal, based on a transfer function that indicates a relationship between the input signal and the analog output signal and uses a time constant of the amplifier circuit and the digital output signal; and
    converting the recovered input signal into an analog input signal,
    wherein, in the recovering of the input signal, a delayed signal of the digital output signal is used for recovering the input signal.

12. The method of claim 11, wherein the transfer function has a single pole.

13. The method of claim 11, wherein, in the recovering of the input signal, a time required for recovering the input signal is shorter than the time constant.

14. The method of claim 11, wherein, in the recovering of the input signal, when the digital output signal is sampled for a first period, the digital output signal is delayed by an integer multiple of the first period.

15. The method of claim 14, wherein the input signal is obtained by subtracting the product of the delayed signal and a first variable from the digital output signal, and
    the first variable is expressed by the time constant and an exponential function.

16. The method of claim 11, wherein the input signal is a current signal ranging between an order of magnitude in nanoamperes (nA) and an order of magnitude in attoamperes (aA), and the analog output signal is a voltage signal.

17. The method of claim 11, further comprising calculating a correction value by comparing the input signal with a preset threshold value.

18. The method of claim 11, wherein the recovering the input signal comprises recovering the input signal from the amplified input signal, by removing an effect of the time constant of the signal amplifier from the amplified input signal.

* * * * *